United States Patent [19]

Murakami et al.

[11] Patent Number: 5,212,415
[45] Date of Patent: May 18, 1993

[54] PRECHARGE CIRCUIT

[75] Inventors: Kiyoharu Murakami, Kawasaki; Ryosuke Matsuo, Yokohama, both of Japan

[73] Assignee: Kabushiki Kaisha Toshiba, Kawasaki, Japan

[21] Appl. No.: 799,960

[22] Filed: Nov. 29, 1991

[30] Foreign Application Priority Data

Nov. 30, 1990 [JP] Japan ................................ 1-336070

[51] Int. Cl.$^5$ ..................... H03K 17/687; H03K 19/01
[52] U.S. Cl. ..................... 307/578; 307/264; 307/296.2; 307/482; 307/583
[58] Field of Search ............ 307/482, 583, 578, 264, 307/246.2

[56] References Cited

U.S. PATENT DOCUMENTS 5,021,686 6/1991 Kawata et al. .................. 307/482
5,029,282 7/1991 Ito ..................................... 307/296.2

OTHER PUBLICATIONS

IBM Tech. Discl Bul. vol. 29 No. 1, Jun. 1986 "Charge Pump Circuit for a CMOS Substrate Generator".

IBM Tech. Disc. Bul. vol. 31 No. 1 Jun. 1988 "Circuit for pumping current out of a negative substrate".

Primary Examiner—William L. Sikes
Assistant Examiner—Margaret Rose Wambach
Attorney, Agent, or Firm—Foley & Lardner

[57] ABSTRACT

A precharge circuit is provided with a step-up node circuit including a capacitor for delivering a drive voltage at a predetermined level to a load, and for raising the voltage level of the drive voltage so that it becomes equal to a value greater than the predetermined level by a specific value. This precharge circuit at least comprises a main P-channel MOS transistor for delivering the drive voltage at the predetermined level to the load through the step-up node circuit when a step-up input signal delivered to the step up node circuit is at a ground level, and a subsidiary P-channel MOS transistor for interrupting supply of the step-up input signal immediately before the drive voltage is raised to the predetermined level by the step-up input signal. Accordingly this precharge circuit normally operates immediately after being powered. Thus, initialization becomes unnecessary.

4 Claims, 4 Drawing Sheets

PRECHARGE CIRCUIT

BACKGROUND OF THE INVENTION

This invention relates to a precharge circuit, and more particularly to a precharge circuit used for the precharge operation of a dynamic random access memory (DRAM), etc. driven by a single power supply and having no need for initialization. The initialization mentioned above refers to a standby operation for a time period until the precharge circuit is caused to normally function after being powered.

A conventional precharge circuit used for the precharge operation of a DRAM, etc. is shown in FIG. 1. This precharge circuit comprises N-channel metal oxide semiconductor (MOS) transistors (hereinafter referred to as transistors for convenience) $N_1, \ldots N_8$, N-channel MOS capacitors (hereinafter referred to as capacitors for convenience) $C_{ap1}, \ldots C_{ap4}$, inverter circuits $I_{NV1}, \ldots I_{NV3}$, and a NOR circuit NOR1. This precharge circuit operates in such a manner that when the voltage level of an input signal provided for step-up operation as inputted to the input terminal of capacitor $C_{ap4}$ is equal to a zero level irrespective of values of an input signal $I_{N1}$ inputted to the drain of the transistor $N_I$, an input signal $I_{N2}$ inputted to one end of the capacitor $C_{ap1}$, and an input signal $I_{N3}$ inputted to the input terminal of the inventor circuit $I_{NV1}$, the level of the potential on the output terminal Boot becomes the power supply voltage $V_{cc}$ level. However, when the voltage level of the input signal Push is equal to the power supply voltage $V_{cc}$ level, the potential on the output terminal Boot is stepped up so that it is greater than $V_{cc}+V_{Th}$, where $V_{Th}$ represents a threshold value of a MOS transistor.

The problems with the above-mentioned conventional precharge circuit will now be described with reference to FIG. 2. In the initial state (time $t_0$) immediately after the precharge circuit is powered, input signals $I_{N1}$, $I_{N2}$ and $I_{N3}$ are either at the power supply voltage $V_{cc}$ level provided by a single power supply, i.e., at a high of "H" level, or at a zero level (reference level), i.e., at a low or "L" level. It is now assumed that those signals are at "H" level. Generally, capacitors $C_{api}$ (i=1, ... 4) are (electrostatically) coupled with nodes connected to respective output terminals at the points of time when input signals inputted to the respective input terminals vary, and their rise or fall operations have been completed. For this reason, at the time $t_0$, there occurs no connection between the capacitor $C_{ap1}$ and the node 101. As a result, the level of a potential on the node 101 connected to the source of the transistor $N_1$ becomes equal to the level of $V_{cc}-V_{Th}$. This potential is applied to the gates of the transistors $N_2$ and $N_3$. On the other hand, the node 103 connected to the output terminal of the inverter circuit $I_{NV1}$ is placed at the in "L" level in potential because the input signal $I_{N3}$ is in the state of "H" level. Accordingly, the level of potential on the node 104 connected to the output terminal of the inverter circuit $I_{NV2}$ becomes equal to "H" level, and the level of a potential on the node 105 connected to the output terminal of the inverter circuit $I_{NV3}$ becomes equal to "L" level. Since the nodes 103 and 105 connected to respective input terminals of the NOR circuit NOR1 are at "L" level, the node 106 connected to the output terminal of the NOR circuit NOR1 is held at "H" level, i.e., level of the power supply voltage $V_{cc}$. On the other hand, the node 102 connected to the drains of the transistors $N_3$ and $N_4$ and the gate of the. transistor $N_5$ is kept at a potential level $V_{cc}-V_{Th}$ by the transistor $N_4$. Further, the node 107 connected to the drains of the transistors $N_5$ and $N_6$, the gate of the transistor $N_7$, and the output terminal of the capacitor $C_{ap3}$ is kept at a potential level $V_{cc}-V_{Th}$ by the transistor $N_6$. In addition, the output terminal Boot of the precharge circuit connected to the drains of the transistors $N_7$ and $N_8$ and the output terminal of the capacitor $C_{ap4}$ is kept at a potential level $V_{cc}-V_{Th}$ by the transistor $N_8$.

When the input signal $I_{N1}$ is caused to change or shift from "H" to "L" level at time $t_1$, the transistor $N_1$ is placed in an OFF state. As a result, while the node 101 is seemingly at a potential level of $V_{cc}-V_{Th}$, it is actually in a floating state (also referred to as H floating (high-floating) in this case). Thereafter, at time $t_2$, when the input signal $I_{N2}$ is caused to shift from "H" to "L" level, the capacitor $C_{ap1}$ is (electrostatically) coupled with the node 101. As a result, the level of potential on the node 101 shifts from the level $V_{cc}-V_{Th}$ to "L" level, but the levels of potentials on the other nodes, e.g., the level of potential on the node 107 or the output terminal Boot remain at the previous level. Further, at time $t_3$, when the input signal $I_{N3}$ is caused to shift from "H" to "L" level, the level of a potential on the node 103 shifts to "H" level and the level of potential on the node 106 shifts to "L" level, and the capacitor $C_{ap2}$ is coupled with the node 102. Thus, the potential level of the node 102 is stepped up, so a level of a potential on of node 102 becomes equal to a value of $V_{cc}-V_{Th}$ or more. For this reason, the level of the potential on the node 107 connected to the drain of the transistor $N_5$ becomes equal to the Vcc level. At this time (time $t_3$), when the level of the input signal Push is caused to shift from "L" to "H" level, the capacitor $C_{ap4}$ is (electrostatically) coupled with the output terminal Boot, so the level of voltage (potential) on the output terminal Boot is stepped up. Namely, when the input signal Push is at "L" level a potential, the level of a potential on the output terminal Boot is equal to $V_{cc}-V_{th}$, while when the input signal Push is at "H" level, the level of potential on the output terminal Boot is equal to $V_{cc}$. In other words, when the input signal Push is at "L" level, a normal output of the precharge circuit does not exceed the level $V_{cc}$. Further, when the input signal Push is at "H" level, the level of the normal output of the precharge circuit does not exceed a level of more than $V_{cc}+V_{Th}$. For this reason, it is required to carry out initialization as shown below.

At time $t_4$, the level of the input signal $I_{N1}$ is caused to shift from "L" to "H" level, and the level of the input signal Push is caused to shift from "H" to "L" level. As a result, the node 101 is kept at the level $V_{cc}-V_{Th}$ by the transistor $N_1$, and the output terminal Boot is kept also at the level $V_{cc}-V_{Th}$. Thereafter, at time $t_5$, when the level of the input signal $I_{N2}$ is caused to shift from "L" to "H" level, the capacitor $C_{ap1}$ is coupled with the node 101. As a result, the level of voltage (potential) on the node 101 is stepped up to a certain level more than $V_{cc}+V_{Th}$. Further, at time $t_6$, When the potential level of the input signal $I_{N3}$ is caused to shift from "L" to "H" level, the node 103 is kept at "L" level by the inverter circuit $I_{NV1}$, so the capacitor $C_{ap2}$ is coupled with the node 102. At this time, since the level of potential on the node 101 is above $V_{cc}+V_{Th}$, the node 102 is kept at the level $V_{cc}$ by the transistor $N_3$. On the other hand, the level of potential on the node 106 connected to the output terminal of the NOR circuit NOR1 shifts from "L" to "H" level. Thus, the capacitor $C_{ap3}$ is coupled with the node 107, so the level of voltage (potential) on the node 107 is stepped up to a certain level above $V_{cc}+V_{Th}$. Accordingly, the output terminal Boot is kept at the level Vcc by the transistor N7.

When the level of the input signal $I_{N1}$ is caused to shift from "H" to "L" level at time $t_7$, and the level of the input signal $I_{N2}$ is caused to shift from "H" to "L" level at time $t_8$, the level of voltage (potential) on the node 101 is stepped or dropped down to a certain level below $V_{cc}-V_{Th}$ by the capacitor $C_{ap1}$. Thereafter, at time $t_9$, when the potential level of the input signal $I_{N3}$ is caused to shift from "H" to "L" level, the level of potential on the node 103 is allowed to shift from "L" to "H" level by the inverter circuit $I_{NV1}$, and the level of potential on the node 106 is caused to shift from "H" to "L" level by the inverter circuits $I_{NV2}$ and $I_{NV3}$ and the NOR circuit NOR1. Accordingly, the capacitor $C_{ap2}$ is coupled with the node 102, and the capacitor $C_{ap3}$ is coupled with the node 107. Thus, the level of voltage (potential) on the node 102 is stepped up by the capacitor $C_{ap2}$ from the level $V_{cc}$ to a certain level above $V_{cc}+V_{Th}$, and the level of voltage (potential) on the node 107 is dropped down by the capacitor $C_{ap3}$ to the level $V_{cc}$. At this time (time $t_9$), when the potential level of the input signal Push is caused to shift from "L" to "H" level, the level of voltage (potential) on the output terminal Boot is stepped up from the level $V_{cc}$ to a certain level above $V_{cc}+V_{Th}$.

Thereafter, when the potential levels of the input signals $I_{N1}$, $I_{N2}$ and $I_{N3}$ are respectively caused to shift from "L" to "H" level at times $t_{10}$, $t_{11}$ and $t_{12}$, and the level of the input signal Push is caused to shift from "H" to "L" at time $t_{10}$, the output terminal Boot of the precharge circuit is held at the level $V_{cc}$.

As described above, in the conventional precharge circuit, immediately after being powered, the level of potential on the output terminal Boot is below $V_{cc}-V_{Th}$. At this time, even if the potential level of the input signal Push shifts from "L" to "H" level, the level of potential on the output terminal Boot becomes equal to $V_{cc}$. Namely, this level is lower than a normal level (above $V_{cc}+V_{Th}$). That potential level is conspicuously dropped by greater degree according to the power supply voltage becoming smaller. As a result, there was the possibility that a device using such a precharge circuit, e.g., a DRAM might be erroneously operated.

Further, it is necessary to carry out initialization in order to provide a normal output level, but the node 101 is in a floating state as previously described for a time period from the time $t_1$ to the time $t_2$. Generally, such a node in the floating state may be apt to follow other nodes because of the coupling, etc., causing erroneous operation of the precharge circuit.

SUMMARY OF THE INVENTION

This invention has been made in consideration of the above-mentioned problems, and its object is to provide a precharge circuit capable of normally operating without the necessity of carrying out initialization.

The precharge circuit of this invention comprises a first P channel MOS transistor having a gate terminal supplied with a first input signal, and a source terminal and a substrate terminal supplied with an output signal; an N-channel MOS transistor having a gate terminal supplied with the first input signal, a source terminal to which the ground of a power supply is connected, and a drain terminal to which a drain terminal of the first P-channel MOS transistor is connected; and a second P-channel MOS transistor having a gate terminal to which the drain terminal of the first P-channel MOS transistor is connected, a source terminal to which a positive potential supply source is connected, and a drain terminal and a substrate terminal, supplied with the output signal.

In accordance with the precharge circuit thus constructed, a first input signal is inputted to the input terminal of a CMOS inverter comprised of the first P-channel MOS transistor and the N channel MOS transistor. As a result, an output of the CMOS inverter is delivered to the gate terminal of the second P-channel MOS transistor. Thus, when the drain terminal of the second P-channel MOS transistor is used as the output terminal of the precharge circuit of this invention, the precharge circuit of this invention normally operates immediately after it is powered. For this reason, initialization as required in the prior art becomes unnecessary.

In accordance with this invention, the precharge circuit may normally operate without carrying out initialization.

DETAILED DESCRIPTION OF THE PREFERRED EMBODIMENT

Figure 1:
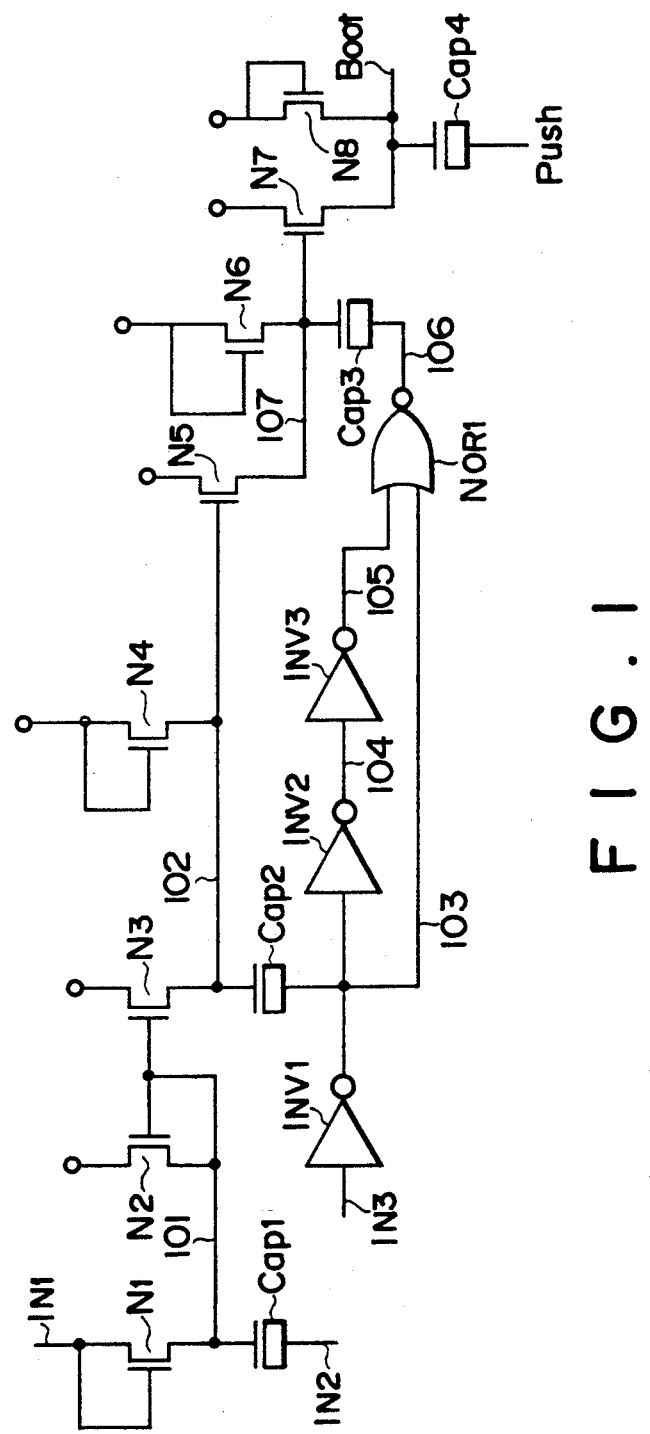
FIG. 1 is a circuit diagram showing a conventional precharge circuit.
Figure 2:
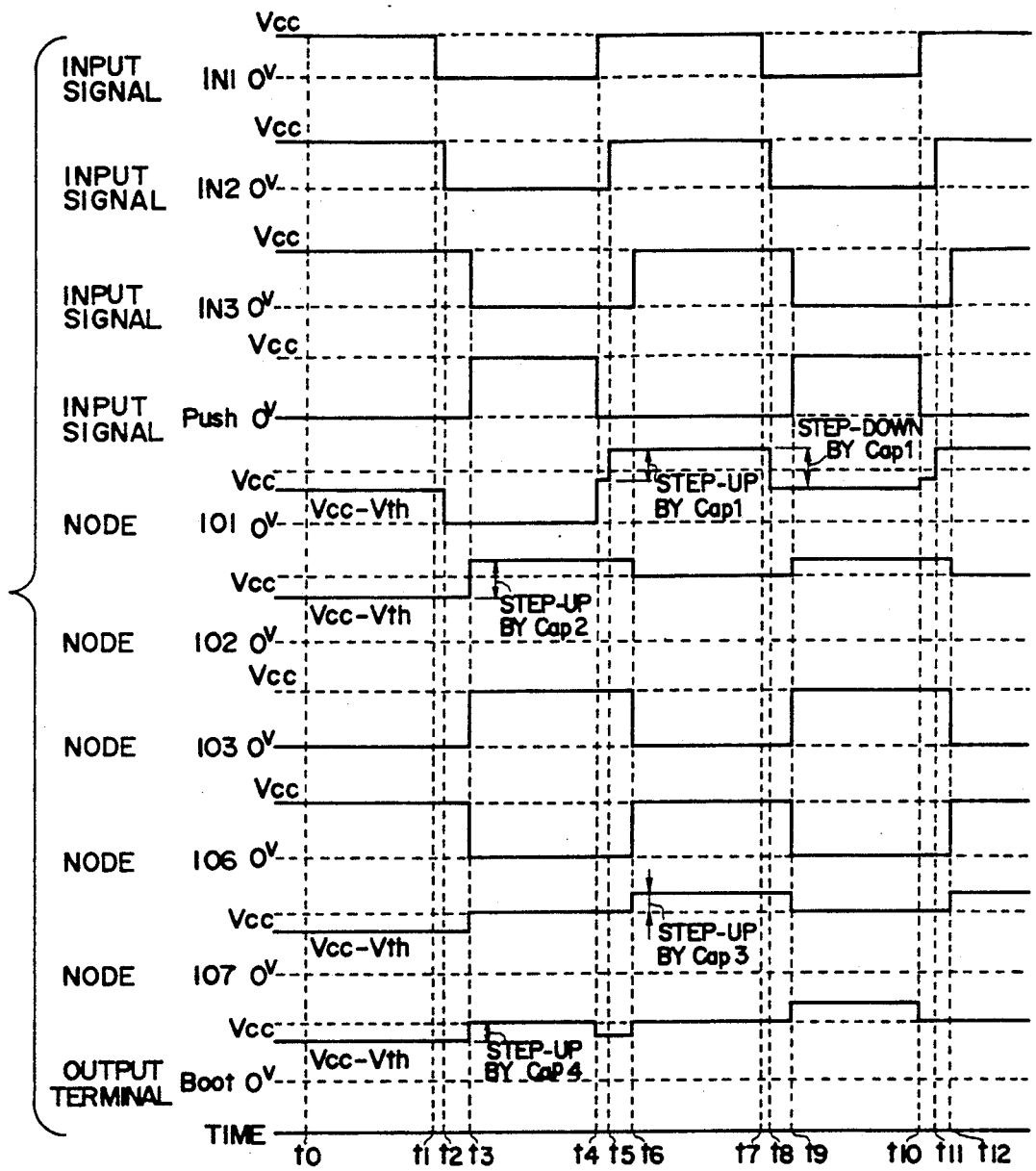
FIG. 2 is a time chart for explaining the operation of the conventional precharge circuit shown in FIG. 1.
Figure 3:
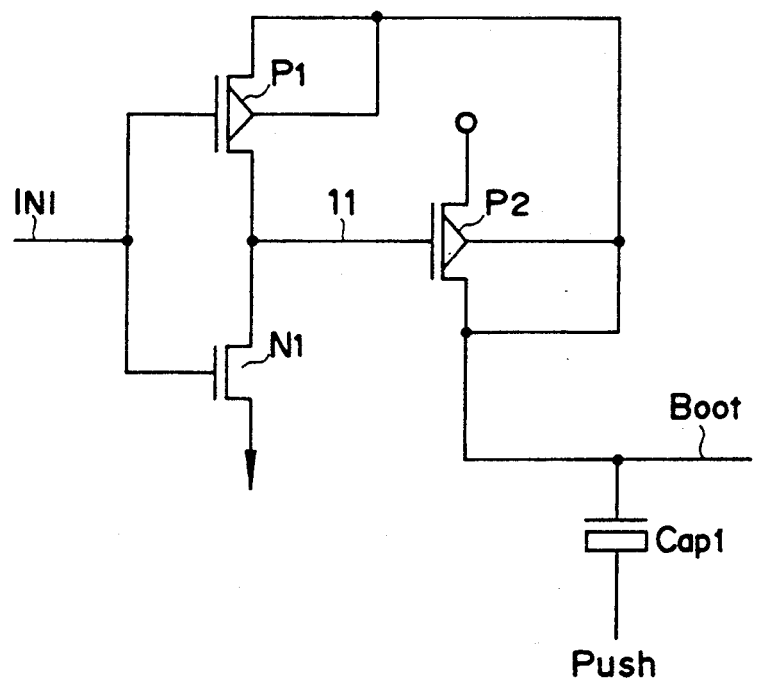
FIG. 3 is a circuit diagram showing a precharge circuit according to an embodiment of this invention.

An embodiment of a precharge circuit according to this invention is shown in FIG. 3. The precharge circuit of this embodiment comprises a CMOS inverter, comprised of an N-channel MOS transistor (hereinafter simply referred to as a transistor) $N_1$ and a P-channel MOS transistor (hereinafter simply referred to as a transistor) $P_1$, a P-channel MOS transistor $P_2$, and an N-channel MOS capacitor (hereinafter referred to as a capacitor) $C_{ap1}$. The source terminal of the transistor $P_2$ is connected to the power supply voltage Vcc terminal, and the drain terminal thereof is connected to the substrate terminal and is also connected to the source terminal of the transistor $P_1$ of the CMOS inverter. Further, the gate terminal of the transistor $P_2$ is connected to an intermediate node 11 of the transistors $P_1$ and $N_1$, which serves as an output terminal of the CMOS inverter. One end (output terminal) of the capacitor $C_{ap1}$ is connected to the output terminal Boot together with the drain terminal of the transistor $P_2$. Further, a ground potential Vss (=0) is applied to the source terminal of the transistor $N_1$ of the CMOS inverter, and an input signal $I_{N1}$ is applied to the gates of the transistors $P_1$ and $N_1$. In addition, another input signal Push is applied to the input terminal of the capacitor $C_{ap1}$.

Figure 4:
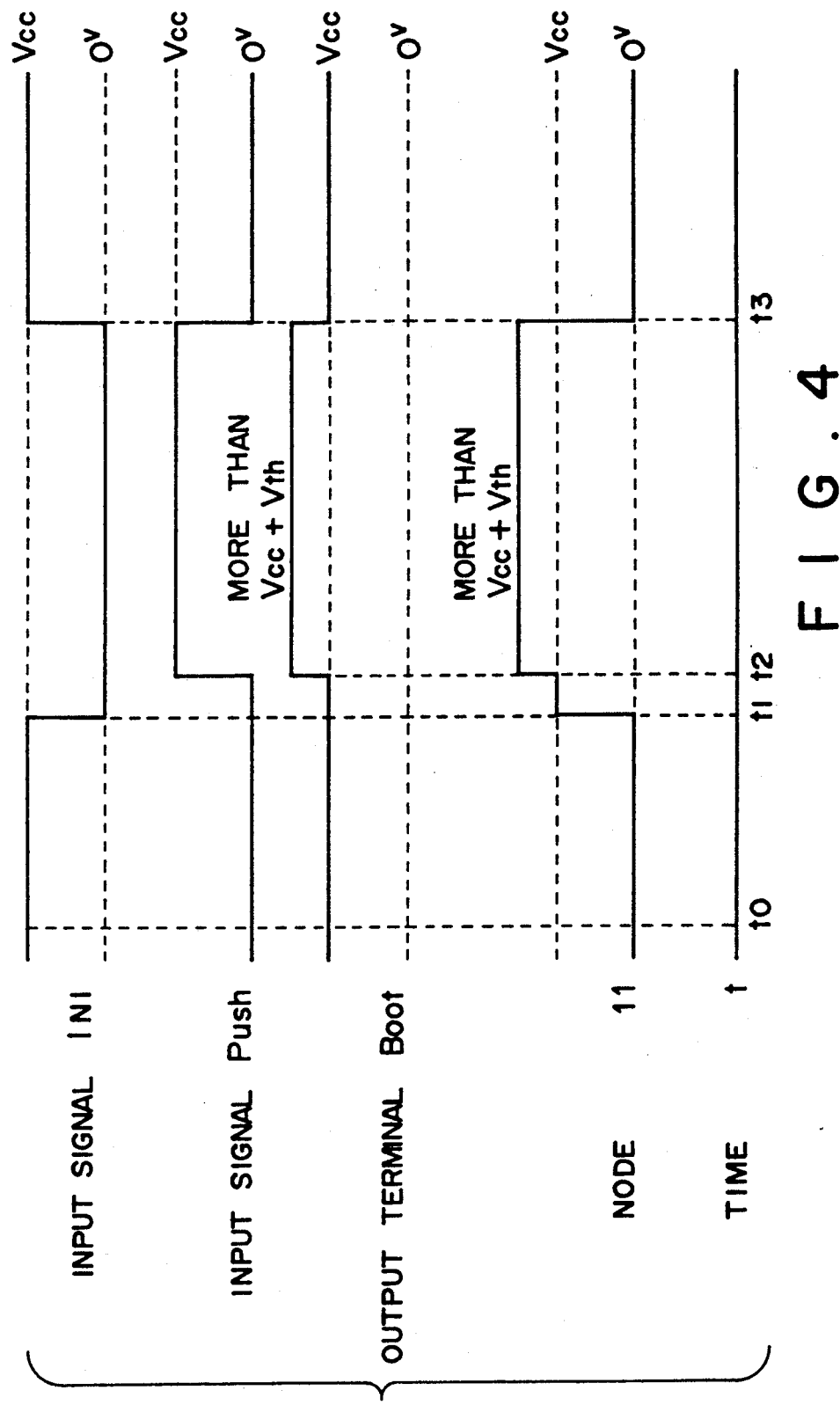
FIG. 4 is a time chart for explaining the operation of the precharge circuit shown in FIG. 3.

The operation of the above-described precharge circuit will now be described with reference to FIG. 4. In the initial state immediately after the precharge circuit is powered (time $t_0$), it is now assumed that the input signal $I_{N1}$ is at the level Vcc, i.e., in "H" level state, and the input signal Push is at zero level, i.e., in "L" level state. At this time, the transistors $P_1$ and $N_1$ constituting the CMOS inverter are turned OFF and ON, respectively. As a result, the potential level of the node 11 becomes equal to the ground level Vss, i.e., "L" level. Thus, the transistor $P_2$ is turned ON, so the potential level of the output terminal Boot becomes equal to Vcc level. Thereafter, when the level of the input signal $I_{N1}$ shifts to "L" level at time $t_1$ ($>t_0$), the transistor $I_{N1}$ is turned OFF and the transistor $P_1$ is turned ON. Thus, the potential level of the node 11 shifts from "L" to "H" level, so the transistor $P_2$ is turned OFF. However, since the output terminal Boot is connected also to the substrate terminal, its potential level is unchanged to maintain the state Vcc.

When the level of the input signal Push changes from "L" to "H" at time $t_2$ ($>t_1$), the capacitor $C_{apl}$ is coupled with the output terminal Boot to step up the potential level of the output terminal Boot so that it is above the level $V_{cc}+V_{Th}$. At this time, the node 11 is charged so that its level becomes equal to substantially the same level as the level of the output terminal Boot through the transistor $P_1$. Thus, there is no possibility that charges on the output terminal Bopt are discharged to the power supply connected on the source side of the transistor $P_2$ through the transistor $P_2$.

Thereafter, at time $t_3$, when the level of the input signal $I_{N1}$ is caused to shift from "L" to "H" level, and the level of the input signal Push is caused to shift from "H" to "L" level, the transistors $P_1$ and $N_1$ are turned OFF and ON, respectively. As a result, the potential level of the node 11 shifts to "L" level. Thus, the transistor $P_2$ is turned ON, so the level of the output terminal Boot becomes equal to $V_{cc}$.

As described above, the precharge circuit of this embodiment can normally operate immediately after being powered. Thus, initialization becomes unnecessary.

It is to be noted that since a CMOS inverter is used, no node is placed in a high-floating state.

In addition, the circuit configuration of the precharge circuit according to this invention becomes is simpler than that of the conventional precharge circuit.

As will be understood from the above description, this invention aims at stepping up a voltage level $V_{cc}$ from a single power supply to a specific level higher by the threshold value $V_{Th}$ in order to drive a load such as a DRAM, etc. The technology for realizing this by using the configuration of the present P-channel MOS transistor $P_2$ has been not disclosed until now. Only the prior technology using the above N-channel transistor configuration rather than the P-channel transistor $P_2$ configuration had been conventionally proposed. However, with an approach which merely replaces the N-channel transistor by the P-channel transistor $P_2$, there was considerable difficulty in that, when the potential level of the output terminal Boot reaches the power supply voltage level $V_{cc}$, discharge begins from the sub-terminal of the transistor $P_2$, so a desired voltage level above "$V_{cc}+V_{Th}$" cannot be maintained. For this reason, this invention employs a novel configuration and technique such that the P-channel MOS transistor $P_1$ is turned on immediately before the output drive voltage Boot exceeds the predetermined voltage $V_{cc}$ due to the drive voltage Boot being raised by the step-up input signal Push, and is turned off when the gate voltage of the P-channel MOS transistor $P_1$ becomes the same as the drive voltage Boot.

Thus, this invention is characterized by the provision of a main P-channel MOS transistor for raising the dive voltage level up to the power supply voltage level $V_{cc}$ which serves as a reference, and the provision of a subsidiary P-channel MOS transistor for interrupting the action of the step-up input voltage in order to eliminate the problem in which discharge starts when the main transistor reaches the $V_{cc}$ level.

What is claimed is:

1. A precharge circuit having step-up node means including a capacitor for supplying a drive voltage having a predetermined level, for raising said drive voltage to a stepped-up voltage level which is greater by a specific value than said predetermined level and for delivering said drive voltage at said predetermined level or at said stepped-up voltage level to a load, said precharge circuit comprising:

main transistor means comprising a main P-channel metal oxide semiconductor (MOS) transistor having a gate terminal, a source terminal, a drain terminal and a substrate terminal;

subsidiary transistor means comprising a subsidiary P-channel metal oxide semiconductor (MOS) transistor having a gate terminal, a source terminal, a drain terminal and a substrate terminal;

means for connecting said drain terminal of said subsidiary transistor to said gate terminal of said main transistor;

means for connecting said source terminal of said main transistor to a positive potential power supply;

means for supplying a first input signal to said gate terminal of said subsidiary transistor; and means for supplying said drive voltage to said source and substrate terminals of said subsidiary transistor;

said main transistor means providing said drive voltage at said predetermined level for delivery to said load through said step-up node means when a step-up input signal at ground level is input to said step-up node means;

said subsidiary transistor means turning on, due to said drive voltage being raised by said step-up input signal, immediately before said drive voltage exceeds said predetermined value and turning off due to said gate of said subsidiary transistor being input with a voltage level which is the same level as said drive voltage.

2. A precharge circuit as set forth in claim 1, which further comprises an N-channel MOS transistor having a gate terminal supplied with said first input signal, a source terminal to which a ground power supply is connected, and a drain terminal to which said drain terminal of said subsidiary transistor is connected.

3. A precharge circuit as set forth in claim 2, wherein said capacitor comprises an N-channel MOS capacitor having a first terminal supplied with said step-up input signal, and a second terminal at which said drive voltage appears.

4. A precharge circuit as set forth in claim 3, wherein when said step-up input signal is at a ground level, said first input signal serves as a positive potential supply source, and immediately before said step-up input signal rises up to a positive potential supply source level, said first input signal falls down to said ground level.

* * * * *